(12) United States Patent
Sun et al.

(10) Patent No.: US 6,776,873 B1
(45) Date of Patent: Aug. 17, 2004

(54) YTTRIUM OXIDE BASED SURFACE COATING FOR SEMICONDUCTOR IC PROCESSING VACUUM CHAMBERS

(76) Inventors: Jennifer Y Sun, 9964 Alpine Ter., Sunnyvale, CA (US) 94086; Shun Jackson Wu, 7747 Lilac Way, Cupertino, CA (US) 95014; Senh Thach, 32257 Jean Dr., Union City, CA (US) 94587; Ananda H Kumar, 1999 Blackfoot Dr., Fremont, CA (US) 94539; Robert W Wu, 3112 Paseo Granada, Pleasanton, CA (US) 94566; Hong Wang, 10355 Cherrytree La., Cupertino, CA (US) 95014; Yixing Lin, 18026 King Ct., Saratoga, CA (US) 95070; Clifford C Stow, 480 N. Winchester Blvd. #5, Santa Clara, CA (US) 95050

( * ) Notice: Subject to any disclaimer, the term of this patent is extended or adjusted under 35 U.S.C. 154(b) by 0 days.

(21) Appl. No.: 10/075,967

(22) Filed: Feb. 14, 2002

(51) Int. Cl.[7] .................. C23F 1/00; H01L 21/306; C23C 16/00
(52) U.S. Cl. .................. 156/345.41; 118/723 R
(58) Field of Search .................. 118/715, 723 R; 156/345.1

(56) References Cited

U.S. PATENT DOCUMENTS

| | | | | |
|---|---|---|---|---|
| 5,488,825 A | * | 2/1996 | Davis et al. .................. 60/806 |
| 5,605,637 A | * | 2/1997 | Shan et al. .................. 216/71 |
| 5,680,013 A | * | 10/1997 | Dornfest et al. .................. 315/111.21 |
| 5,762,748 A | * | 6/1998 | Banholzer et al. .................. 156/345.1 |
| 5,798,016 A | * | 8/1998 | Oehrlein et al. .................. 156/345.37 |
| 5,904,800 A | * | 5/1999 | Mautz .................. 156/345.1 |
| 6,170,429 B1 | * | 1/2001 | Schoepp et al. .................. 118/723 R |
| 6,408,786 B1 | * | 6/2002 | Kennedy et al. .................. 118/723 AN |
| 6,521,046 B2 | * | 2/2003 | Tanaka et al. .................. 118/715 |
| 2001/0003271 A1 | * | 6/2001 | Otsuki .................. 118/723 I |
| 2002/0110698 A1 | * | 8/2002 | Singh .................. 428/472 |
| 2003/0010446 A1 | * | 1/2003 | Kajiyama et al. .................. 156/345.1 |
| 2003/0075109 A1 | * | 4/2003 | Arai .................. 118/728 |

FOREIGN PATENT DOCUMENTS

| | | | | |
|---|---|---|---|---|
| DE | 19955134 A1 | * | 5/2001 | .......... F23D/14/66 |
| EP | 293198 A2 | * | 11/1988 | .......... C23C/14/02 |
| JP | 03287797 A | * | 12/1991 | .......... C25D/11/18 |
| JP | 2001023908 A | * | 1/2001 | .......... H01L/21/205 |
| JP | 2001049419 A | * | 2/2001 | .......... C23C/4/00 |

* cited by examiner

*Primary Examiner*—Parviz Hassanzadeh
*Assistant Examiner*—Karla Moore
(74) *Attorney, Agent, or Firm*—Shirley L. Church; Loretta A Peters

(57) ABSTRACT

To further enhance the chamber material performance of anodized aluminum alloy materials against fluorine and oxygen plasma attack, a ceramic-based surface coating, high purity yttrium oxide coating, is provided on the anodized aluminum alloy parts.

6 Claims, 2 Drawing Sheets

YTTRIUM OXIDE BASED SURFACE COATING FOR SEMICONDUCTOR IC PROCESSING VACUUM CHAMBERS

BACKGROUND OF THE INVENTION

1. Field of the Invention

The present invention relates to equipment utilized in the manufacture of semiconductor integrated circuits (IC) and, in particular, to utilization of a yttrium oxide ($Y_2O_3$) coating on the anodized aluminum alloy components utilized in a semiconductor integrated circuit vacuum process chamber to improve corrosion resistance and erosion.

2. Discussion of the Related Art

Corrosion/erosion resistance is a critical property for parts used in IC fabrication vacuum chambers, where both corrosive chemistries and high-energy plasma bombardment reduce component lifetime and create contamination problems.

Anodized aluminum alloy is a primary material used in making components utilized in IC processing chambers. However, the high concentration of impurities contained in conventional aluminum alloy causes formation of precipitates in the alloy which, in turn, cause internal cracks in the anodization layer. The integrity of the anodization layer is, thus, deteriorated and its corrosion resistance is severely damaged. The impurity concentration (wt. %) of "conventional" aluminum alloy, such as 6061, is as follows: Mg=0.8–1.20; Cu=0.15–0.40; Zn=max. 0.25; Mn=max. 0.15; Fe=max. 0.70; Si=0.40–0.80; Others=max. 0.15

More recently, high purity aluminum alloy material has been developed, resulting in minimal internal cracking in the anodization layer. Current data shows that chamber parts made from high purity aluminum alloy materials perform much better than those made from conventional alloy "High purity" aluminum alloy means aluminum alloy with all impurities other than Mg being less than about 0.1 wt. % each, particularly Si, Fe and Cu.

Although high purity anodized aluminum alloy has a much better corrosion/erosion rate than the traditional anodized aluminum alloy, the anodization layer will still be attacked by the aggressive chamber environment after prolonged usage. The resulting need to replace parts reduces tool up-time and increases the cost of ownership.

Therefore there is always a need to continuously improve the lifetime of the aluminum alloy chamber components.

We are aware that yttrium oxide coatings have been used on anodized aluminum in the automobile and aerospace industries.

SUMMARY OF THE INVENTION

We have found that applying a ceramic-based surface protective layer, a yttrium oxide ($Y_2O_3$) coating, on the anodized surface of aluminum alloy chamber components improves the resistance of the anodized surface to corrosion and erosion by a factor of 5× over the anodized surface alone, particularly in the fluorine/oxygen plasma environment typically used in fabricating ICs.

A better understanding of the features and advantages of the present invention will be obtained by reference to the following detailed description and accompanying drawings that set forth an embodiment in which the principles of the invention are utilized.

DETAILED DESCRIPTION

Figure 1B:
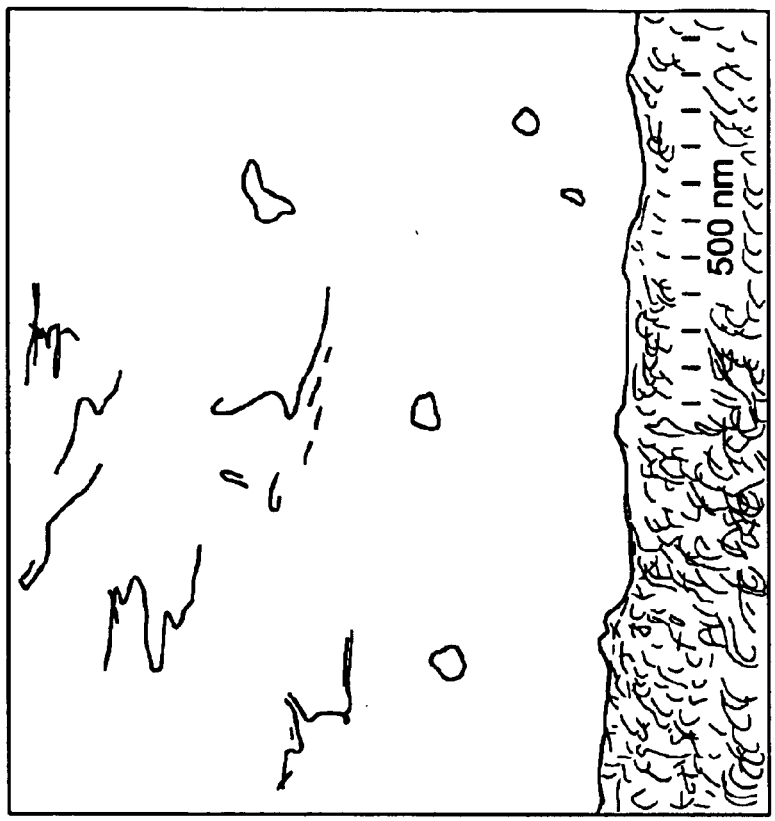
FIG. 1B is a cross-sectional schematic drawing based on an SEM photomicrograph showing a yttrium oxide coating on anodized aluminum alloy at higher resolution than the SEM photomicrograph upon which the drawing in FIG. 1A is based.

Prototype vacuum chamber components made from high purity anodized aluminum alloy (e.g., chamber liner, cathode liner and door) were coated with various candidate materials for testing with respect to erosion rate. A final chamber test with coated parts was then conducted to verify the performance of the coating. The result of chamber tests showed that plasma spray coated $Y_2O_3$ had the lowest etch rate among all tested materials.

Anodization of the aluminum alloy can be in accordance with the disclosure of commonly-assigned and co-pending U.S. patent application Ser. No. 10/071,869, filed Feb. 8, 2002, titled "Halogen-Resistant Anodized Aluminum for Use in Semiconductor Processing Apparatus", which application is hereby incorporated by reference in its entirety to provide additional background information regarding the present invention.

In accordance with the disclosure in U.S. application Ser. No. 10/071,869, the alloy may be a high purity aluminum alloy having the following composition by weight %: a magnesium concentration ranging from about 3.5% to about 4.0%, a silicon concentration ranging from 0% to about 0.03%, an iron concentration ranging from 0% to about 0.03%, a copper concentration ranging from about 0.02% to about 0.07%, a manganese concentration ranging from about 0.005% to about 0.015%, a zinc concentration ranging from about 0.08% to about 0.16%, a chromium concentration ranging from about 0.02% to about 0.07%, and a titanium concentration ranging from 0% to about 0.01%, with other single impurities not exceeding about 0.03% each and other total impurities not exceeding about 0.1%. In addition, the aluminum alloy may be required to meet a particular specification with respect to particulates formed from mobile impurities. For example, of the particulate agglomerations of impurity compounds, at least 95% of all particles are advantageously less than 5 μm in size. Five (5) % of the particles may range from 5 μm to 20 μm in size. Finally, no more than 0.1% of the particles should be larger than 20 μm, with no particles being larger than 40 μm. For particular applications, the high purity alloy specification related to particle size and particle size distribution may be relaxed from the requirement that no more than 0.1% of the particles are larger than 20 μm, with no particles being larger than 40 μm, to a requirement that no more than 0.2% of the particles are larger than 20 μm, with no particles being larger than 50 μm.

Further in accordance with the disclosure in U.S. application Ser. No. 10/071,869, prior to anodization of the aluminum alloy, it is important to chemically clean and polish the aluminum alloy surface. The cleaning is carried out by contacting the surface of the aluminum article with an acidic solution including about 60% to 90% technical trade phosphoric acid, having a specific gravity of about 1.7 and about 1%–3% by weight of nitric acid. The article temperature during cleaning is typically in the range of about 100°

C. and the time period the surface of the article is in contact with the cleaning solution ranges from about 30 to about 120 seconds. This cleaning and polishing time period is often referred to as the ""bright dip" time. Typically the cleaning process is followed by a deionized water rinse.

Subsequent to cleaning, anodization of the aluminum alloy surface is carried out, to create a protective aluminum oxide film on the alloy surface. The anodization is carried out electrolytically in a water-based solution comprising 10% to 20% by weight sulfuric acid and about 0.5% to 3.0% by weight oxalic acid. The anodizing temperature is set within a range from about 5° C. to about 25° C., and typically within a range from about 7° C. to about 21° C. The article to be "anodized" serves as the anode, while an aluminum sheet of standard 6061 serves as the cathode. It has been discovered that it is very important that during the electrolytic oxidation process the current density, in Amps/Square Foot (ASF) in the electrolytic bath, ranges from about 5 ASF to less than 36 ASF. Further, a "barrier layer" thickness at the base of the aluminum oxide film is controlled by the operating (anodization) voltage, which typically ranges from about 15 V to about 30 V. Common practice has indicated that each 1 V increase in anodization voltage increases the barrier layer thickness at the base of the film by about 14 Å.

The particular combination of process variables described above also produces an oxidized aluminum layer which is more densely packed and more uniform than previously known in the art. For example, the size of the internal pores within the hexagonal cells of the oxidized aluminum film of the present invention range in size from about 300Å to about 700Å. This is compared with previously known oxidized aluminum films, where the pore size varied from about 100Å to about 2000Å in diameter. As a result, the density of the present oxidized film is generally higher, providing improved abrasion resistance. Depending on the application, the normal range of the anodized film thickness is between about 0.7 mils to about 2.5 mils (18 $\mu$m to 63 $\mu$m).

The aluminum alloy substrate which includes a controlled particulate size and distribution of mobile impurities as described above prevents interference of particulate inclusions at the surface of an aluminum alloy article with the formation of a smooth transition from the alloy surface to an overlying aluminum oxide protective film, providing an improvement in the protective capabilities of the aluminum oxide film.

Specifically with respect to application of a $Y_2O_3$ coating over an anodized surface of a high purity aluminum substrate, high purity 99.95% yttria was sprayed on coupons made from anodized high purity aluminum alloy material utilizing commercially available plasma spray coating techniques. Other techniques for applying the coating, e.g., chemical vapor deposition (CVD) and physical vapor deposition (PVD), are also appropriate.

Although the invention may be practiced utilizing conventional aluminum alloy, utilization of high purity aluminum alloy enables application of a barrier for the applied coating.

The typical coating thickness is 5–7 mils. Important physical properties of the $Y_2O_3$ coating are listed as follows:

| Composition | >99.9% semiconductor Grade $Y_2O_3$ |
| --- | --- |
| Porosity | 1–2% max. |
| Density | 5.0 g/cc |
| Hardness | >500 HV 0.3 (by cross-section) |
| Ra ($\mu$in) | 120 |

-continued

| CTE | 8–9 $\mu$m/m/° C. |
| --- | --- |
| Thermal Conductivity | 8–12 W/m. ° K. |
| Coating Adhesion | 3700 psi (on bare Al substrate) |
| | 7100 psi (on anodized Al substrate) |
| Dielectric Constant | 6–8 (ASTM D-159) |

Figure 1A:
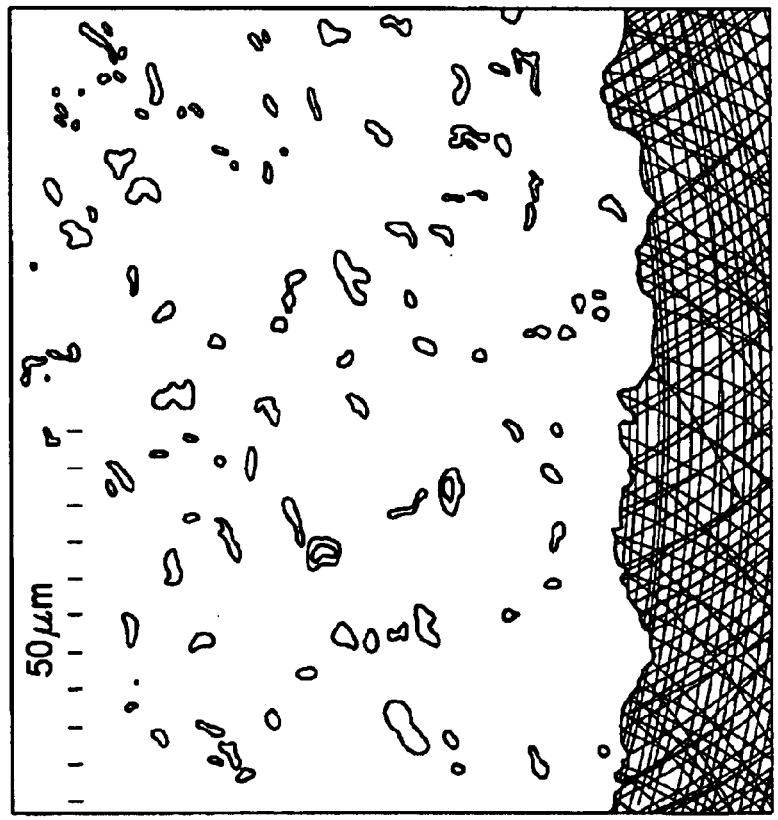
FIG. 1A is a cross-sectional schematic drawing based on an SEM photomicrograph showing a yttrium oxide coating on anodized aluminum alloy.

FIG. 1A shows a cross-sectional schematic drawing of an as-coated sample. FIG. 1B shows a similar cross-sectional drawing taken from an SEM cross-section at higher resolution (100× higher). The FIG. 1A/1B drawings clearly show that the coating layer was dense, with all pores being isolated from each other. The maximum porosity was determined to be less than 1–2% based on the apparent metal-logtaphic method. The $Y_2O_3$ coating to high purity aluminum alloy substrate interface is intact. No delamination or other interfacial defects, such as voids and cracks, are observed.

It should be understood that up to about 10% $Al_2O_3$ can be combined with the $Y_2O_3$ to provide a $Y_2O_3$-based coating with improved hardness and breakdown voltage characteristics.

Electrical properties were tested per ASTM standards in order to satisfy minimally required electrical properties for plasma chamber components. The results are listed below:

| Breakdown Voltage of $Y_2O_3$ Coating (V) | | |
| --- | --- | --- |
| | total voltage | voltage per mil |
| anodization (1 mil) | 1,533 | 1,533 |
| $Y_2O_3$ on bare Al (6 mil) | 5,232 | 872 |
| $Y_2O_3$ on anodized Al | 5,894 | 843 |

| Volume Resistivity (ohm-cm) | | | |
| --- | --- | --- | --- |
| | 25° C. | 60° C. | 150° C. |
| anodization (1 mil) | 7.4E15 | 4.1E15 | 4.9E15 |
| $Y_2O_3$ on bare Al (6 mil) | 1.5E15 | 6.0E14 | 7.8E13 |
| $Y_2O_3$ on anodized Al | 9.8E14 | 4.1E14 | 3.4E13 |

The total breakdown voltage was found to be >5 kv for a 6 mil coating layer, which was well above the 1 kv criteria for a conventional anodization layer. The volume resistivity was also high enough to meet typical process requirements.

One major concern for the spray coated part is surface loose powders which were applied to the substrate during the very last spraying cycle. If these particles are not completely removed by a final finishing/cleaning process, these powders will have a high chance of coming off from the part's surface due to dynamic chamber conditions (erosion, corrosion, and thermal cycle). Once released to the chamber interior, they will cause a severe particle contamination problem.

To assure that no such loose particles are left on the yttrium oxide coating surface, the following methods are used.

Figure 2B:
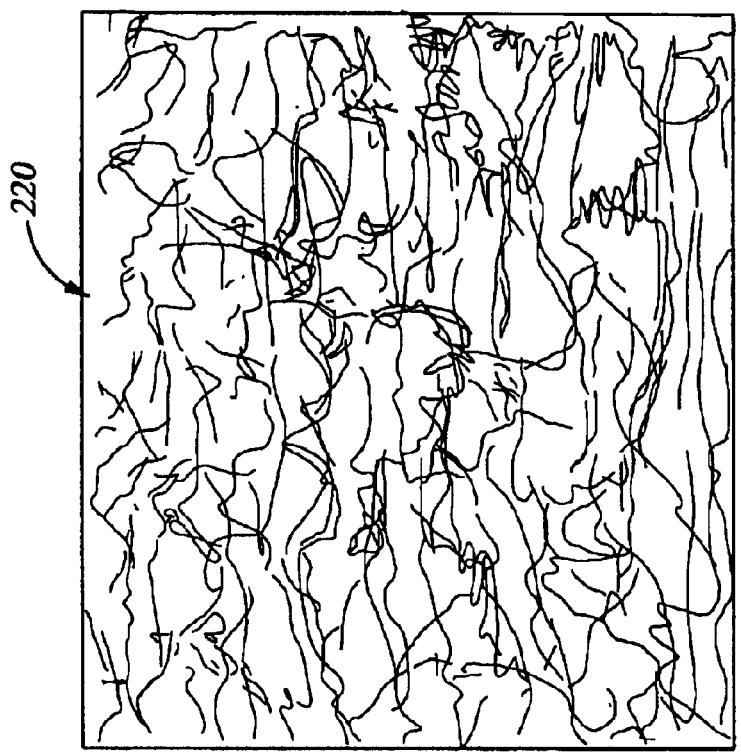
FIGS. 2A and 2B are top view schematic drawings based on SEM photomicrographs showing, respectively, as-coated and after surface finished yttrium oxide coating overlying anodized aluminum alloy, in accordance with the present invention.
Figure 2A:
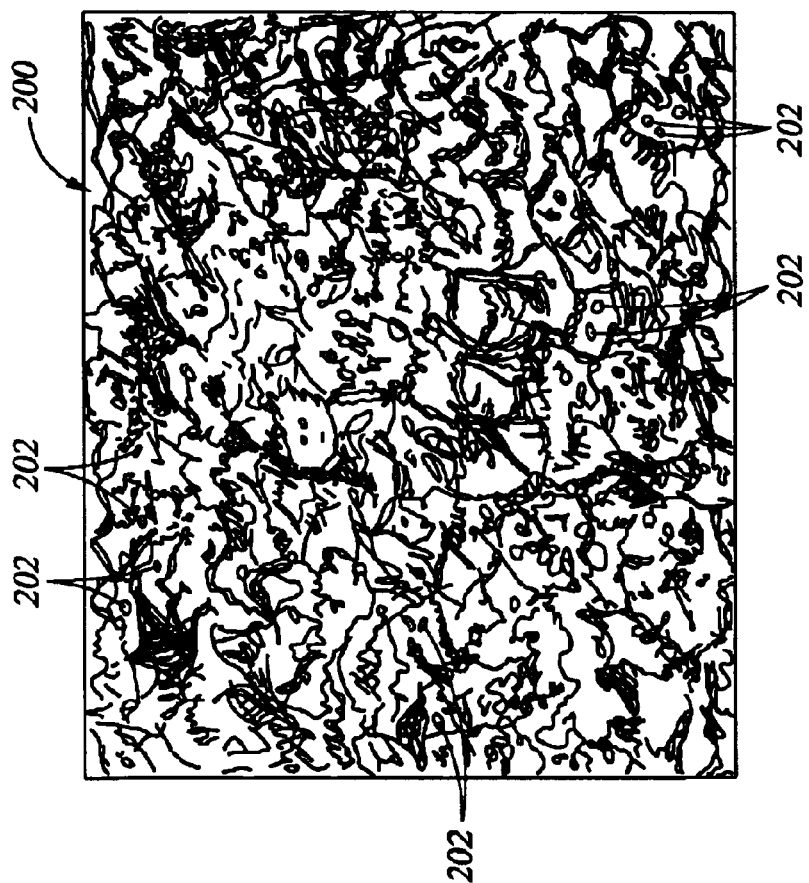

First, a light mechanical finish is performed as part of the coating processes by manually holding a grinding tool over the as-coated surface, suing a silicon carbide (SiC) as the grinding medium. FIGS. 2A and 2B are top view schematic drawings based on SEM photomicrographs that show the as-coated surface 200 and after finishing surface 220, respectively, clearly demonstrating that, after coating, the as-coated surface is very rough, with many power and nodules 202 loosely attached to the surface. However, after finish, the coating surface is dense and free from loose particles.

After coating and surface finish, the coated parts are subjected to a standard cleaning procedure for chamber components that includes a $CO_2$ snow gun clean followed by a deionized (DI) water ultrasonic rinse performed at room temperature for about 15 minutes. All parts are then verified as particle-free by a Dryden QIII tool.

Cleanliness of the coating layer is another subject which requires close monitoring. Contamination can be introduced to the coating layer from various sources: raw powders, spray gun, process gases, and uncontrolled environment.

In the cleanliness study, the well-known Inductively Coupled Plasma—Mass Spectrometry (ICP-MS) technique was used to determine the impurity levels in the coating layer. Table 1 below shows the impurity data of coating coupons. Two types of samples were used: after coating/finish from the coating vendor and after final clean from the cleaning vendor. Both samples were analyzed at surface and sub-surface for comparison. Each scan contained 60 pulses with 20 $\mu$m dia. spot size each pulse. The penetration depth was 1–2 $\mu$m. Sub-surface was achieved by pre-ablated top 1–2 $\mu$m layer away before testing.

There was some impurity difference between surface and sub-surface; in general, the sub-surface was found to be cleaner than the surface. Final clean reduced the coating impurity levels, indicating that the final clean process was effective to remove contaminants from the surface.

TABLE 1

| | $Y_2O_3$ coating impurity analysis (ppm) | | | |
|---|---|---|---|---|
| | after final clean | | after coating and polish | |
| | surface | sub-surface | surface | sub-surface |
| Li | <0.1 | <0.1 | <0.1 | <0.1 |
| Be | <0.1 | <0.1 | <0.1 | <0.1 |
| Na | 6 | <1 | <1 | <1 |
| Mg | 7.9 | 10.0 | 6.7 | 3.2 |
| Al | 123 | 70 | 415 | 213 |
| Ca | <1 | <1 | <1 | <1 |
| Ti | 12.4 | 3.6 | 60.0 | 8.0 |
| Cr | 7 | 7 | 1 | <1 |
| Mn | <1 | <1 | 1 | 11 |
| Fe | 1 | <1 | <1 | 60 |
| Ni | 1.6 | 1.0 | 0.3 | 0.1 |
| Zn | 75.1 | 63.4 | 88.0 | 19.9 |

It should be understood that various alternatives to the embodiments of the invention described herein may be employed in practicing the invention. Further example, as discussed above, it should be understood that in addition to high purity 99.95% yttria, any yttria based coating will provide erosion/resistance enhancements over anodization alone. Thus, it is intended that the following claims define the scope of the invention and that methods and structures within the scope of these claims and their equivalents be covered thereby.

What is claimed is:

1. A processing chamber component resistant to a plasma including fluorine and oxygen species, said component comprising:

a high purity aluminum substrate where particulates formed from mobile impurities have a particle size distribution such that no more than 0.2% of the particles are larger than 20 $\mu$m, with no particles being larger than 50 $\mu$m;

an anodized coating on a surface of the high purity aluminum substrate; and a protective coating comprising yttrium oxide overlying the anodized coating.

2. A processing chamber component in accordance with claim 1, wherein said high purity aluminum substrate particle size distribution with respect to particulates formed from mobile impurities is such that at least 95% of all particles must be less than 5 $\mu$m in size, with no more than 0.1% of the particles being larger than 20 $\mu$m, and with no particles being larger than 40 $\mu$m.

3. A processing chamber component in accordance with claim 1, wherein said protective coating includes aluminum oxide up to about 10% by weight.

4. A process chamber component in accordance with claim 1, wherein said protective coating is 99.95% by weight or greater yttrium oxide.

5. A process chamber component in accordance with claim 1, wherein said protective coating applied using a method selected from the group consisting of spray coating, chemical vapor deposition, and physical vapor deposition.

6. A process chamber component in accordance with claim 5, where the coating comprising yttrium oxide has been mechanically finished to remove loose particles.

* * * * *